United States Patent [19]

George et al.

[11] 4,128,896
[45] Dec. 5, 1978

[54] ONE-LEVEL SWITCH FOR MAGNETIC BUBBLE DOMAIN DEVICES

[75] Inventors: Peter K. George, Morgan Hill; Isoris S. Gergis, Yorba Linda; Tsutomu Kobayashi, Placentia, all of Calif.

[73] Assignee: Rockwell International Corporation, El Segundo, Calif.

[21] Appl. No.: 820,073

[22] Filed: Jul. 28, 1977

[51] Int. Cl.² .............................................. G11C 19/08
[52] U.S. Cl. ......................................... 365/12; 365/43
[58] Field of Search ........................ 365/12, 15, 16, 43

[56] References Cited

U.S. PATENT DOCUMENTS

| 3,810,133 | 5/1974 | Bobeck et al. | 365/12 |
| 4,007,453 | 2/1977 | Bonyhard et al. | 365/12 |

Primary Examiner—James W. Moffitt
Attorney, Agent, or Firm—H. Fredrick Hamann; G. Donald Weber, Jr.

[57] ABSTRACT

There is provided a switch which is useful in magnetic bubble domain devices. This switch can be used to replicate, transfer or annihilate bubble domains in a magnetic bubble domain memory system. The switch comprises a half-disk (or pick-axe) shaped element which is disposed adjacent to two juxtaposed magnetic bubble domain propagation paths.

A re-entrant current path conductor is integrally connected to the half-disk element and associated with at least one of the propagation paths whereby magnetic bubble domains can be stretched, cut, annihilated or the like in response to a control current signal.

Optional bar elements are associated with the half disk elements of the switch to improve the operating characteristics thereof.

13 Claims, 24 Drawing Figures

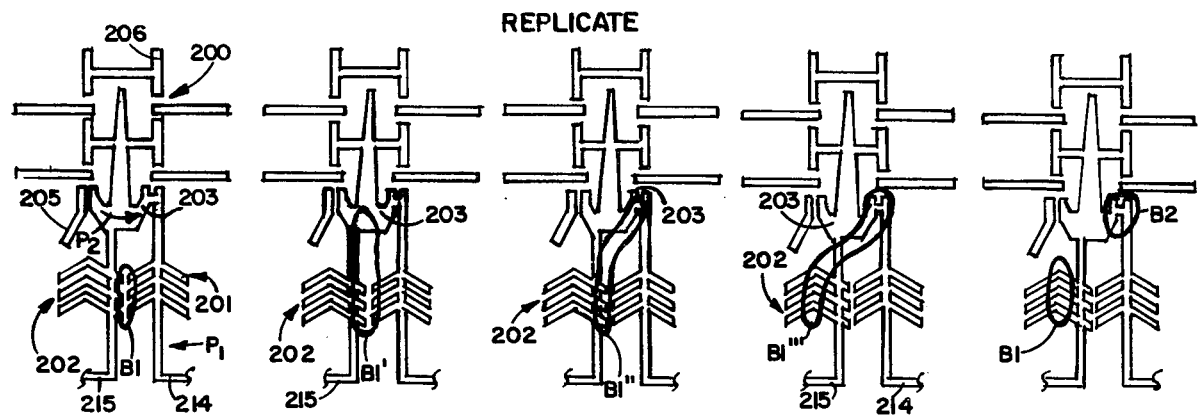
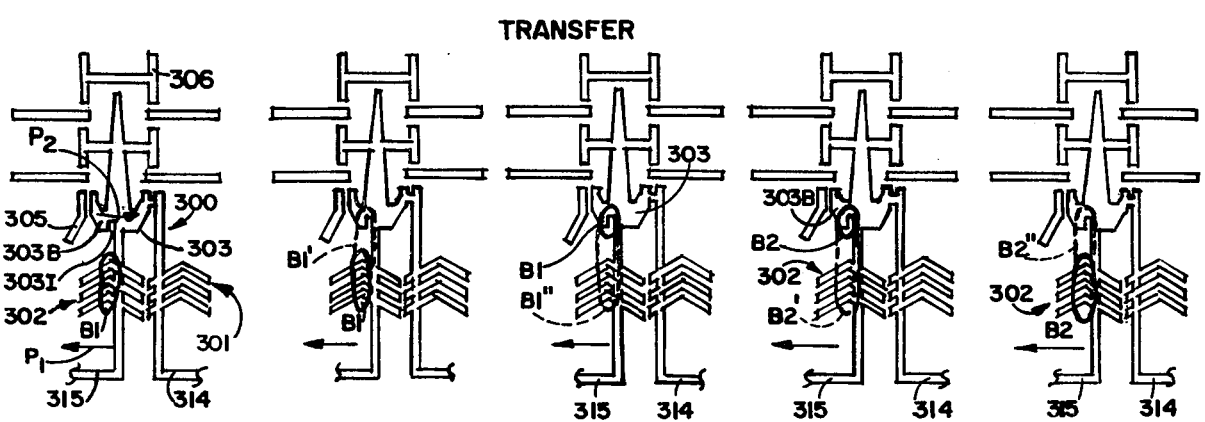

TRANSFER

TRANSFER

ONE-LEVEL SWITCH FOR MAGNETIC BUBBLE DOMAIN DEVICES

BACKGROUND OF THE INVENTION

1. Field of the Invention

This invention is directed to magnetic bubble domain devices, in general, and to a one-level switch for use with magnetic bubble domain systems, in particular.

2. Prior Art

Magnetic bubble domain devices and systems are well known in the art. Currently, device, material and fabrication development is underway in order to improve operating characteristics of these bubble domain memory systems. These improvements are directed toward optimizing system organizations as well as toward increasing capacity (chip and memory) through the the use of gap tolerant propagation structures and superior fabrication techniques. Improved fabrication techniques will permit greater densities of devices, greater reliability and simplication of the fabrication processes.

One area which is the subject of much examination is the use of one-level device components including switches. To date there are only two one-level switches known. One of these switches is reported by T. J. Nelson, AIP Conference Proceedings, No. 18, Part 1, pages 95-99 (1974). In this device, a pair of opposed chevron columns are interconnected by a conductor path which passes through the apices of the chevron columns. This switch has been shown to work reasonably well in either the transfer mode or the replicate mode. However, this switch is very difficult to use in a major-minor loop chip organization inasmuch as designing a current return path compatible with the chip layout is a significant problem. While it is proposed to provide the current return path by utilization of a second gross masking process for producing another conductor layer to provide the return path, the second masking process inevitably complicates the fabrication process (relative to a one mask process) thereby resulting in lower fabrication yield. Moreover, this approach is not significantly less complicated than a two level process.

A second one level switch is proposed by Bobeck et al, IEEE Transactions on Magnetics, MAG-9, pages 474-480 (1973). In this switch, oppositely directed chevron columns are offset one from another and a pair of conductors are interconnected therebetween adjacent the ends of the respective chevron columns. While this switch has the advantage of having a current return path, it has been shown that a current required for stretching a bubble from one track to the other is far too high to be practical for a one level design. This is because the current applied to stretch a bubble from a minor loop to a major loop is divided into several paths (determined by the number of chevrons per column) thus weakening the field produced along the upper chevron. Reference is made to Kryder et al, IEEE Transactions on Magnetics, MAG-11, pages 1145-1147 (1975) for the analysis which has demonstrated the shortcomings of the Bobeck et al switch. Consequently, there are no one-level switches known in the art which are available for use in a practical major-minor loop chip organization.

SUMMARY OF THE INVENTION

There is shown a one-level magnetic bubble domain device switch which permits transfer, replication or annihilation of magnetic bubble domains. The switch is incorporated between two propagation paths with a basic transfer element thereof included in one of the paths. The basic element, i.e. a half-disk pattern, does not introduce a significant timing delay or cause significant margin degradation in either major or minor loop propagation paths.

The conductor path associated with the switching element can pass through the major loop propagation path with virtual impunity allowing ease of interconnection.

BRIEF DESCRIPTION OF THE DRAWINGS

FIGS. 1A-1D show one embodiment of the invention in which the conductors are placed symmetrically about the minor loop axis and illustrates the replicator operation thereof.

FIGS. 2A-2E show another embodiment of the invention and illustrates the replicator operation thereof.

FIGS. 3A-3E show another embodiment of the invention and illustrates the transfer in and out operation thereof.

DESCRIPTION OF THE PREFERRED EMBODIMENTS

Figure 4A:
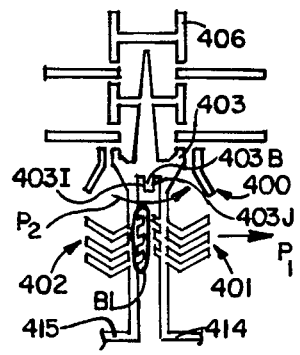
FIGS. 4A-4D show another embodiment of the invention and illustrates the transfer operation thereof.
Figure 4B:
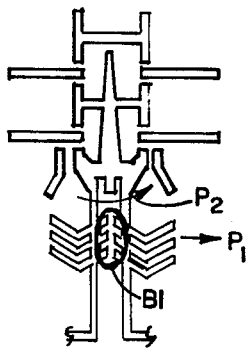

Referring now to FIG. 1A, there is shown a schematic representation of one embodiment of the instant invention. In this embodiment, two propagation paths represented by the arrows P1 and P2 are provided. Propagation path P1 is represented by columns of chevrons 101 and 102. Propagation path P2 includes various elements such as H-bars, I-bars, bent-I-bars and a so-called half-disk or pick-axe element. In particular, I-bars 107, 109, 110 and 112 form portions of propagation path P2. Bent-I-bars 104 and 105 also form portions of path P2. The H-bars in path P2 are elements 106 (in combination with element 113) and element 108 (in combination with element 111). Half-disk element 103 is disposed between bent-I-bars 104 and 105. An extended arm 103A projects from half disk 103 and, in this instance, intersects with the cross member of the H-bar which comprises elements 108 and 111.

Conductors 114 and 115 pass through and are integrally formed with the chevrons in columns 101 and 102, respectively. In addition, conductors 114 and 115 are connected to and integrally formed with half-disk element 103. In a preferred embodiment, indentations 103I, 103J are formed in half-disk element 103 adjacent to the conductors 115 and 114, respectively, thereby forming a tongue-like member 103B. While indentations 103I, 103J are provided to enhance the operating characteristics of the conductors and tongue member 103B, it is to be understood that these indentations can be omitted if desired. Likewise, bar member 103A can also be omitted. However, inclusion of bar 103A enhances the operation of disk 103 and tongue member 103B of half disk 103.

Figure 6:
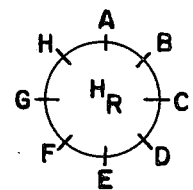
FIG. 6 is a graphic representation of the rotating field $H_R$ in terms of operational positions.

Referring now to FIGS. 1B through 1D, concurrently, the operation of replicate switch 100 is described. Assuming counter-clockwise rotation of rotating field $H_R$ (see FIG. 6) it is assumed that a bubble is propagated through path P1 in the direction shown and has reached the left end of chevron column 101 with $H_R$ at position F (see FIG. 6). At approximately this time, a control signal is applied to conductors 114 and 115 which produces a magnetic field wherein bubble B1 is stretched to the configuration of bubble B1' shown in FIG. 1B. When field $H_R$ has reached position E, a magnetic pole is established at tongue 103B of element 103. As field $H_R$ reaches position D, bubble B1" is attracted to the right ends of chevron column 102 and to the right side of element 103. At approximately this time, the current signal in conductors 114 and 115 is terminated. As $H_R$ continues to rotate toward position A, bubble B1 is stretched across conductors 114 and 115, from the apices of chevron column 102 to the upper ends of elements 103 and 104. At approximately this time, a cutting pulse is supplied to conductors 114 and 115. The pulse is of such magnitude and polarity as to produce a repelling type pole so that the stretched bubble (indicated by the dashed lines) is severed and forms bubbles B1 and B2 which are independent of each other. Bubble B1 then proceeds to propagate through path P1 while bubble B2 propagates through path P2. Thus, the operation of replication has been achieved.

Referring now to FIG. 2A, there is shown another embodiment of the instant invention. In this embodiment switch 200 is provided. The basic concept remains the same. However, certain variations in the switch structure are described. Again, propagation paths P1 and P2 are provided. Propagation path P2 is substantially similar to propagation path P2 in FIG. 1A and includes a plurality of components such as H-bar 206, bent-I bar 205 and half-disk 203. Path P1 comprises chevron columns 201 and 202. Conductors 214 and 215 are connected to half-disk 203 as shown. In particular, conductor 215 passes through the right ends of chevron column 202 and joins the bottom portion of element 203. On the other hand, conductor 214 interconnects the apices of the chevrons in column 201 and is joined to the right end of element 203. Thus, the arrangement of the chevrons relative to the conductors has been changed. In addition, the current path through half-disk element 203 is modified as well. The conductors are spaced further apart and no tongue-like element, per se, is provided.

Referring now to FIGS. 2A through 2E, the operation of the switch 200 is described. In particular, in FIG. 2A bubble B1 is propagated through path P1 to the left ends of chevrons 201. When rotating field $H_R$ reaches approximately the E position (see FIG. 6), a control signal is supplied to conductors 214 and 215 which provides a magnetic field which causes the bubble to stretch, as shown by bubble B1'. Thus, bubble B1' has stretched from the right ends of chevron column 202 to the periphery of element 203 along conductor 215. As field $H_R$ continues to rotate toward the positions D and C and so forth, the upper end of the bubble rotates around the periphery of element 203 as suggested by bubble B1" in FIG. 2C. At approximately this time, the control current on conductors 214 and 215 is removed so that the bubble continues to propagate under the influence of field $H_R$. As shown in FIG. 2D, with the rotating field $H_R$ in approximately the position A (FIG. 6) bubble B1''' is stretched from the apices of chevron column 202 to the right end of element 203. At this time, a cutting pulse is supplied to conductors 214 and 215 causing a magnetic field of appropriate magnitude and polarity such that bubble B1''' is severed. Consequently, bubbles B1 and B2 are produced as shown in FIG. 2E.

These bubbles are then free to propagate through the respective propagation paths as described supra. Consequently, another replication operation has been described in replicate switch 200 which is another embodiment of the instant invention.

Referring now to FIG. 3A, there is shown another embodiment of the instant invention in which transfer in and transfer out are achieved. Again, the similarities of the embodiments are readily apparent especially in the provision of propagation paths P1 and P2. However, modifications are provided in that conductor 314, while connected to the right edge or side of half-disk element 303 is interconnected with the left ends of chevron column 301. Conversely, conductor 315 is connected at approximately the center of the periphery of element 303. However, conductor 315 is between the apices and the right ends of the chevrons in column 302. In addition, indentation 303I is provided adjacent to conductor 315 in element 303 to provide the projection or tongue-like element 303B to enhance a magnetic pole as described hereinafter.

Referring to FIGS. 3A through 3E, concurrently, transfer in and transfer out operations are described. Initially, bubble B1 is propagating through path P1 and achieves the position adjacent the apices of chevrons in column 302 which coincides with position A of rotational field $H_R$ (see FIG. 6). At approximately this time, a current signal is supplied to conductors 314 and 315 to provide a magnetic field and pole which effectively freezes bubble B1 in the position shown. As rotating field $H_R$ rotates toward the position E (see FIG. 6) a magnetic pole is produced in the tongue-like element 303B such that bubble B1 is stretched thereto and forms elongated bubble B1' (shown dashed in FIG. 3B). When bubble B1 has been stretched as shown in FIG. 3B, the control signal on conductors 314 and 315 is terminated. At this point, bubble B1 is attracted to element 303B and elongated bubble B1" (shown dashed) shrinks to the size of bubble B1 as shown in FIG. 3C. Thus, the transfer-in operation has been achieved.

FIGS. 3D and 3E show the transfer-out operation. Bubble B2 propagates through path P1 and is blocked and elongated by a control signal on conductors 315 and 314. Thus, the bubble achieves the elongated configuration shown by bubble B2'. When field $H_R$ reaches approximately the position H (FIG. 6), the control signal is terminated and bubble B2" (shown dashed) essentially contracts into bubble B2 which has been attracted to the apices of chevrons in column 302. Thus, the transfer-out operation has been achieved.

Figure 4C:
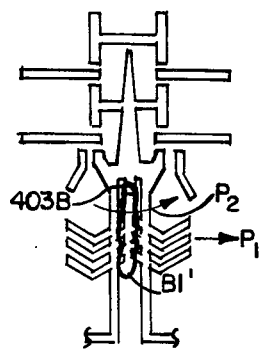
Figure 4D:
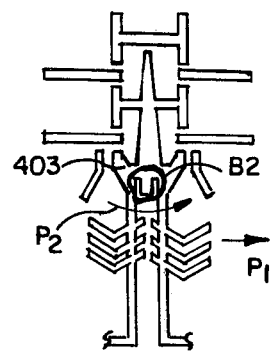

Referring now to FIG. 4A, there is shown another embodiment of the instant invention. Switch 400 is shown to include elements similar to those shown in switch embodiment 100. The major difference between the embodiments shown in switches 100 and switches 400 is the reversal of the direction of the chevrons in chevron columns 401 and 402 in FIG. 4A. Consequently, the switch embodiment shown in FIG. 4A is primarily a transfer and annihilate switch. Again, referring to FIG. 4A through 4D inclusive, the operation of switch embodiment 400 is described. Thus, bubble B1 propagates through path P1 from left to right. Bubble B1 propagates to the right ends of the chevrons in 402 when rotating field $H_R$ reaches position B (see FIG. 6). When field $H_R$ is between position B and position H, the control signal is supplied along conductors 414 and 415 which effectively retards and blocks bubble B1. Consequently, bubble B1 remains between conductors 415 and 414 and is not propagated therebeyond. When field $H_R$ achieves position E, tongue-like element 403B creates a strong attractive magnetic pole so that bubble B1 expands as shown by bubble B1'. As soon as bubble B1' has expanded as shown in FIG. 4C, the control signal is terminated in conductors 414 and 415. Consequently, the bubble contracts at location 403B and forms bubble B2 which now propagates through path P1 and P2 in the described fashion in response to rotating field $H_R$.

Figure 5A:
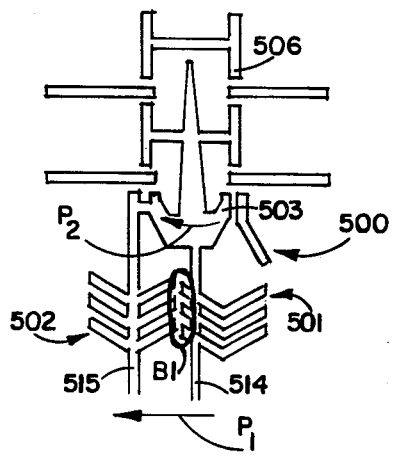
FIGS. 5A-5E show another embodiment of the invention and illustrates the transfer operation thereof.
Figure 5B:
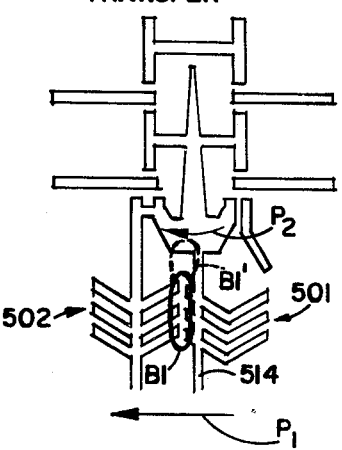
Figure 5C:
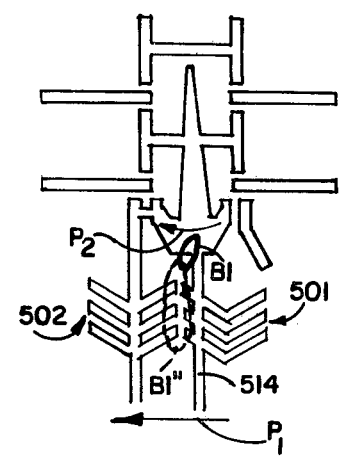

Referring now to FIG. 5A, there is shown another embodiment of the instant invention. The embodiment shown by switch 500 is again a transfer-in and transfer-out type switch which is quite similar to switch embodiment 200 shown in FIG. 2A. Again, the major distinction of switch embodiment 500 is the reversal of the direction of the chevrons in chevron columns 501 and 502. In addition, conductors 514 and 515 are connected to the center and left side of element 503, respectively. Also, conductor 515 is connected to the apices of the chevrons in column 502 while conductor 514 is connected to the left ends of the chevrons in column 501.

With the structure and configuration shown in FIG. 5A, operation of the switch is controlled by rotating field $H_R$ which rotates in a clockwise direction.

Referring to FIGS. 5A through 5E concurrently, the operation of switch 500 is described. As shown best in FIGS. 5B and 5C a transferin operation is provided. That is, bubble B1 propagates to the right end of the chevrons in column 502. Shortly thereafter, the control current is supplied to conductors 514 to provide a magnetic field which retards bubble B1 and expands same as bubble B1' (shown dashed). Bubble B1' extends from the ends of chevrons in column 501 to the periphery of half disk element 503. As field $H_R$ continues to rotate to approximately position E, bubble B1 is attracted to element 503. At approximately this time, current through conductor 514 is terminated wherein the magnetic field and the effect thereof is also terminated. Consequently, the bubble contracts as bubble B1 on element 503. Thus, the transfer-in operation has been achieved.

Figure 5D:
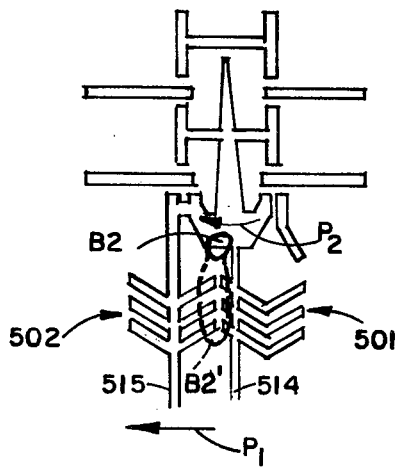
Figure 5E:
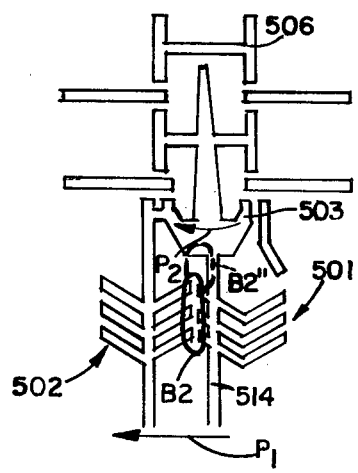

Referring now to FIGS. 5D and 5E in particular, transfer-out operation occurs. That is, bubble B2 is propagated through path P2 and is propagating around the periphery of element 503 under the influence of rotating field $H_R$. When field $H_R$ reaches position E (see FIG. 6), bubble B2 is at the bottom left edge of element 503. At this time, a control current is supplied to conductors 514 and 515 to produce a magnetic field which retards and restrains bubble B2. In addition, bubble B2 is elongated along conductor 514 and assumes the shape of bubble B2' (shown dashed).

When rotating field $H_R$ achieves position H (see FIG. 6) magnetic poles are produced at the left ends of chevrons in chevron column 501 which magnetic poles attract bubble B2. At that time, the control current in conductors 514 and 515 is terminated wherein bubble B2" (shown dashed) is contracted into bubble B2. Therefore, the bubble B2 has been transferred out from path P2 to path P1.

Thus, there have been shown and described several one-level replicate and transfer switches wherein a conductor is formed in the same pattern as the propagation path elements of a magnetic bubble domain device. The conductors are contiguous with and integrated with certain components in each of the propagation paths. These one-level switches permit single level fabrication, can easily be interconnected and do not require impractically high switching currents. The description of the device is meant to be illustrative only and not to be limitative. The scope of the invention is limited only by the claims appended hereto.

Having thus described a preferred embodiment of the invention, what is claimed is:

1. A one-level switch for magnetic bubble domain devices comprising,
   first and second propagation paths deposited adjacent to each other,
   a half-disc transfer element included in said first propagation path and adjacent said second propagation path, and
   a pair of conductor elements integrally formed with said transfer element and with components in said second propagation path to permit current signals to be applied relative to said first and second propagation paths so that magnetic bubble domains can interact between said first and second propagation paths,
   at least one of said conductor elements connected to the base of said transfer element.

2. The switch recited in claim 1 wherein,
   said half-disc transfer element includes a plurality of flattened edges at the periphery thereof.

3. The switch recited in claim 1 wherein:
   said transfer element includes a projection from said half-disc element to form a pick-ax element.

4. The switch recited in claim 1 wherein:
   said pair of conductor elements are connected to the base of said half-disc element.

5. The switch recited in claim 1 including:
   one of said pair of conductor elements is connected to the base of said half-disc element and the other one of said pair of conductor elements is connected to the side of said half-disc element.

6. The switch recited in claim 1 wherein:
   said pair of conductor elements are connected in series via said transfer element.

7. The switch recited in claim 1 including,
   indentations in said half-disc element adjacent at least one of said pair of conductor elements to provide enhanced magnetic poles.

8. The switch recited in claim 1 wherein:
   said second propagation path comprises columns of chevrons which are the components integrally formed with said conductor elements.

9. The switch recited in claim 8 wherein:
   said switch performs transfer to replicate operations as a function of the position of said chevron columns relative to said transfer element.

10. The switch recited in claim 8 wherein:
    the apices of said chevron columns are directed at said transfer element.

11. The switch recited in claim 8 wherein
    each of said pair of conductor elements is formed at a different location in the respective columns of chevrons.

12. The switch recited in claim 1 including:
    at least one bar element disposed adjacent to said transfer element to provide enhanced magnetic poles relative to at least one of said first and second propagation paths.

13. The switch recited in claim 11 wherein,
    said bar element is bent at an obtuse angle.

* * * * *